United States Patent
Sung et al.

(10) Patent No.: US 10,685,865 B2
(45) Date of Patent: Jun. 16, 2020

(54) METHOD AND DEVICE FOR POWER RAIL IN A FIN TYPE FIELD EFFECT TRANSISTOR

(71) Applicant: Varian Semiconductor Equipment Associates, Inc., Gloucester, MA (US)

(72) Inventors: Min Gyu Sung, Essex, MA (US); Sony Varghese, Manchester, MA (US); Johannes Van Meer, Middleton, MA (US); John Hautala, Beverly, MA (US)

(73) Assignee: Varian Semiconductor Equipment Associates, Inc., Gloucester, MA (US)

(*) Notice: Subject to any disclaimer, the term of this patent is extended or adjusted under 35 U.S.C. 154(b) by 0 days.

(21) Appl. No.: 16/037,926

(22) Filed: Jul. 17, 2018

(65) Prior Publication Data
US 2020/0027777 A1    Jan. 23, 2020

(51) Int. Cl.
| | |
|---|---|
| H01L 21/74 | (2006.01) |
| H01L 23/50 | (2006.01) |
| H01L 23/535 | (2006.01) |
| H01L 21/3065 | (2006.01) |
| H01L 21/762 | (2006.01) |
| H01L 21/67 | (2006.01) |
| H01L 21/311 | (2006.01) |
| H01L 29/78 | (2006.01) |

(52) U.S. Cl.
CPC ........ *H01L 21/743* (2013.01); *H01L 21/3065* (2013.01); *H01L 21/31116* (2013.01); *H01L 21/67069* (2013.01); *H01L 21/76224* (2013.01); *H01L 23/50* (2013.01); *H01L 23/535* (2013.01); *H01L 29/785* (2013.01)

(58) Field of Classification Search
CPC ....... H01L 21/31116; H01L 21/823431; H01L 21/834481; H01L 27/10879; H01L 21/823481; H01L 27/10876; H01L 23/5286; H01L 21/67069; H01L 27/0886
See application file for complete search history.

(56) References Cited

U.S. PATENT DOCUMENTS

| | | | | |
|---|---|---|---|---|
| 6,114,725 A | * | 9/2000 | Furukawa | H01L 27/10808 257/330 |
| 2006/0128103 A1 | * | 6/2006 | Prall | G11C 11/5692 438/279 |
| 2011/0073940 A1 | * | 3/2011 | Lee | H01L 21/28518 257/332 |

(Continued)

*Primary Examiner* — Caridad Everhart

(57) ABSTRACT

A method of forming a semiconductor device may include providing a semiconductor device structure. The semiconductor device structure may include semiconductor fins pitched at a fin pitch on a substrate and a mask, disposed over the semiconductor fins, the mask defining a plurality of openings. The semiconductor device structure may further include an isolation oxide disposed on the substrate, between the semiconductor fins. The method may further include directing angled ions into the at least one of the plurality of openings. The angled ions may form at least one trench between at least one pair of the semiconductor fins, in the substrate below the isolation oxide between the at least one pair of the semiconductor fins. Furthermore, a width within the substrate of the at least one trench is greater than a minimum fin pitch and greater than a width of the at least one trench above the substrate.

18 Claims, 8 Drawing Sheets

(56) References Cited

U.S. PATENT DOCUMENTS

| | | | |
|---|---|---|---|
| 2011/0156119 A1* | 6/2011 | Chung | H01L 21/82345 257/306 |
| 2013/0001682 A1* | 1/2013 | Tang | H01L 21/84 257/331 |
| 2019/0165178 A1* | 5/2019 | Chen | H01L 21/823475 |

* cited by examiner

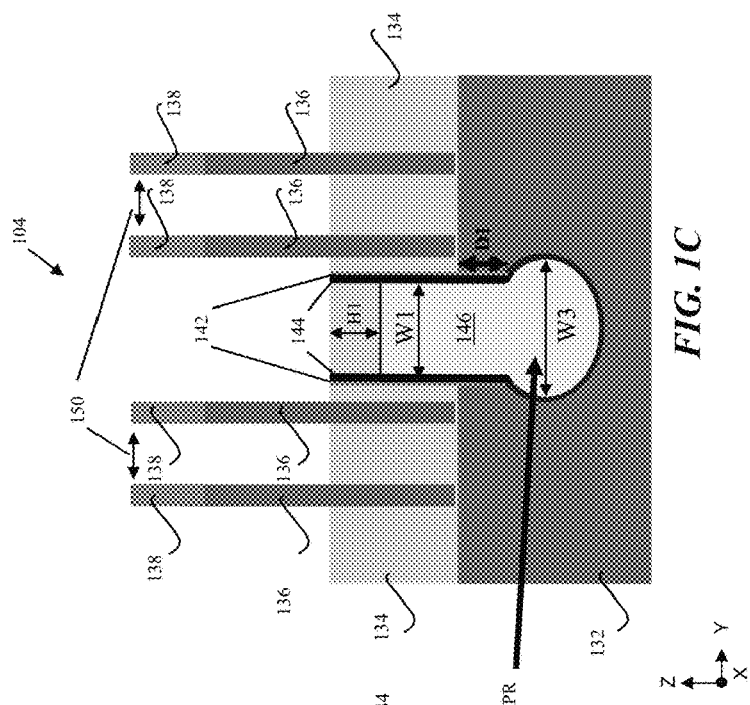
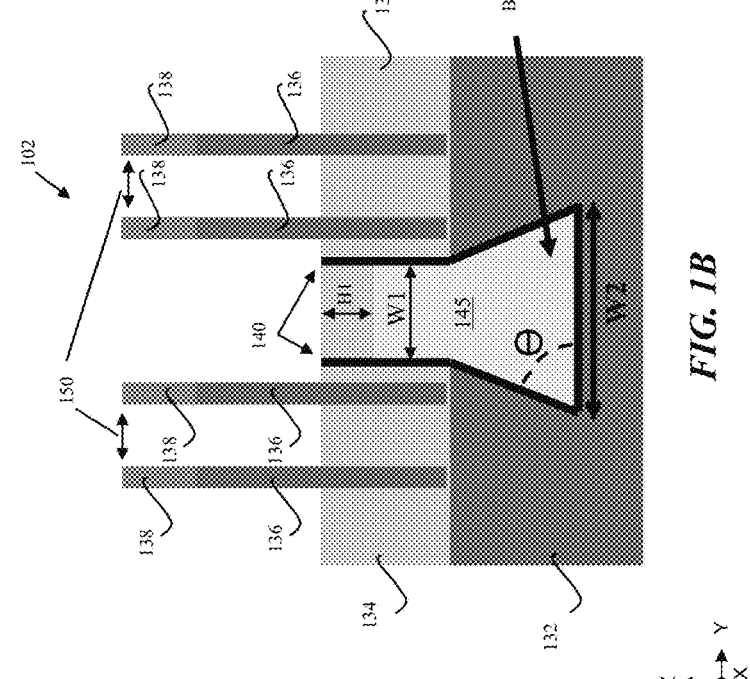
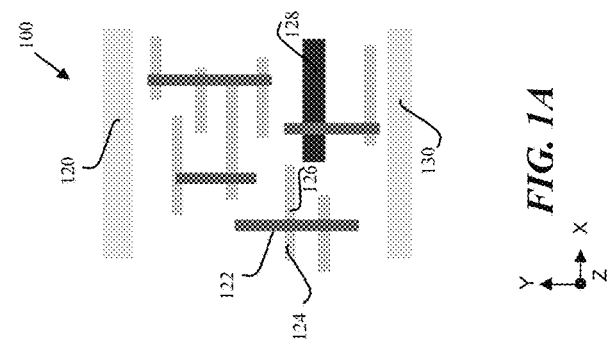

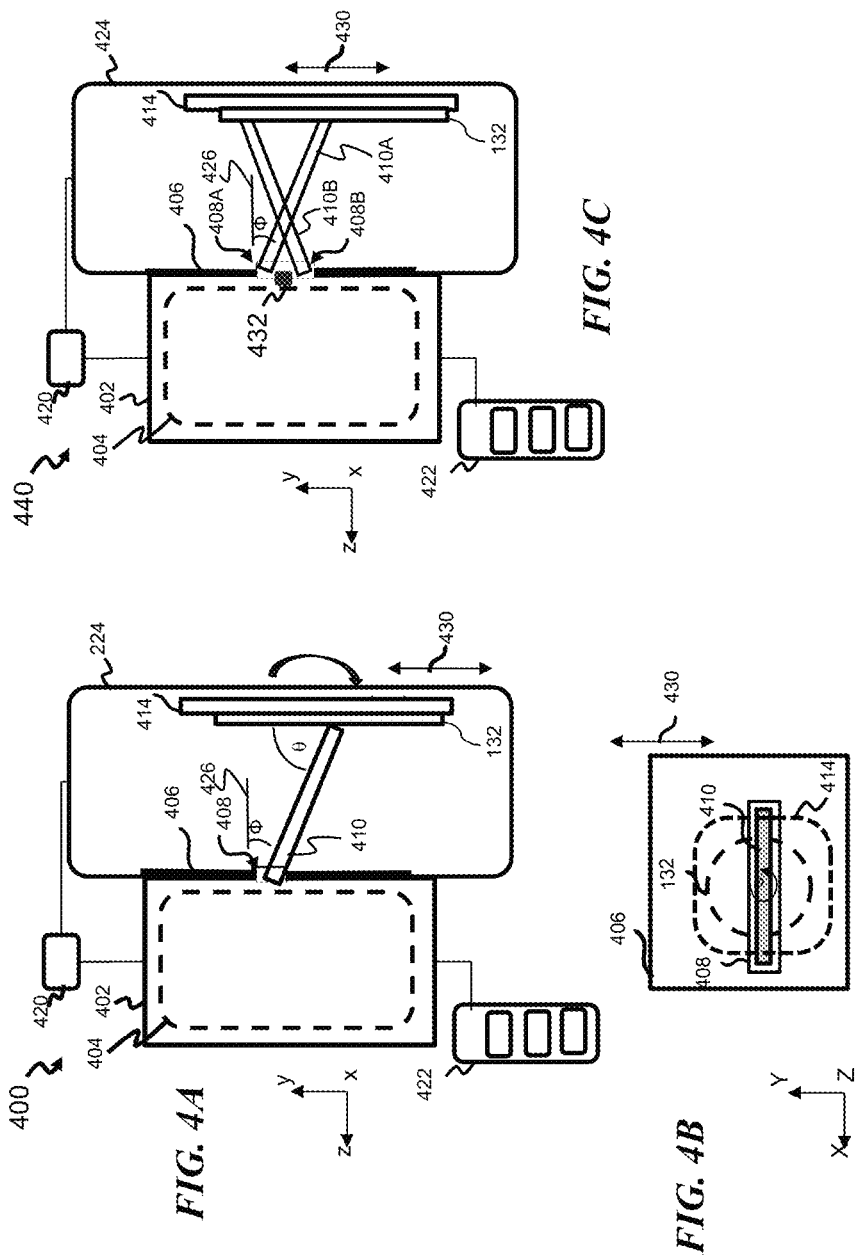

PROVIDING A SEMICONDUCTOR DEVICE STRUCTURE, THE SEMICONDUCTOR DEVICE STRUCTURE COMPRISING: MORE THAN ONE SEMICONDUCTOR FINS PITCHED AT A FIN PITCH ON A SUBSTRATE, A MASK DISPOSED OVER THE MORE THAN ONE SEMICONDUCTOR FINS, THE MASK DEFINING A PLURALITY OF OPENINGS; AND AN ISOLATION OXIDE DISPOSED ON A SUBSTRATE, BETWEEN THE MORE THAN ONE SEMICONDUCTOR FINS
502

DIRECTING ANGLED IONS INTO THE AT LEAST ONE OF THE PLURALITY OF OPENINGS, WHEREIN AT LEAST ONE TRENCH IS FORMED BETWEEN AT LEAST ONE PAIR OF THE SEMICONDUCTOR FINS IN THE SUBSTRATE BELOW AN ISOLATION OXIDE BETWEEN THE AT LEAST ONE PAIR OF THE SEMICONDUCTOR FINS, WHEREIN A WIDTH WITHIN THE SUBSTRATE OF THE AT LEAST ONE TRENCH IS GREATER THAN THE FIN PITCH
504

APPLY A DIELECTRIC LINER BETWEEN THE TRENCH AND THE SUBSTRATE
506

FILL THE AT LEAST ONE TRENCH WITH CONDUCTOR MATERIAL
508

FORM AN ISOLATION OXIDE OVER CONDUCTOR MATERIAL IN THE AT LEAST ONE TRENCH
510

PROVIDING MORE THAN ONE SEMICONDUCTOR FINS ON A SUBSTRATE, MORE THAN ONE SEMICONDUCTOR FINS PITCHED AT A FIN PITCH; A MASK, DISPOSED OVER THE MORE THAN ONE SEMICONDUCTOR FINS, THE MASK DEFINING A PLURALITY OF OPENINGS; AN ISOLATION OXIDE DISPOSED ON A SUBSTRATE, BETWEEN THE MORE THAN ONE SEMICONDUCTOR FINS
602

DIRECTING AN ANGLED ION BEAM INTO A PAIR OF THE PLURALITY OPENINGS FOR A CELL TO FORM A PAIR OF TRENCHES, WHEREIN THE PAIR OF TRENCHES ARE FORMED AT A FIN PITCH THROUGH THE ISOLATION OXIDE AND INTO A SUBSTRATE BENEATH THE ISOLATION OXIDE, A FIRST TRENCH OF THE PAIR DISPOSED ON A FIRST SIDE OF THE CELL AND PARALLEL TO THE MORE THAN ONE SEMICONDUCTOR FINS, A SECOND TRENCH OF THE PAIR DISPOSED ON A SECOND SIDE OF THE CELL, THE SECOND SIDE BEING ON AN OPPOSITE SIDE OF THE CELL FROM THE FIRST SIDE AND BEING PARALLEL TO THE FIRST SIDE, THE ANGLED ION BEAM TO FORM PORTIONS OF EACH OF THE PAIR OF TRENCHES IN THE SUBSTRATE, WHEREIN A WIDTH WITHIN THE SUBSTRATE OF EACH OF THE PAIR OF TRENCHES IS GREATER THAN THE FIN PITCH
604

FILL PAIR OF TRENCHES WITH CONDUCTOR MATERIAL AND RECESS THE CONDUCTOR MATERIAL TO A HEIGHT ABOVE THE SUBSTRATE
606

FILL THE TRENCH WITH AN ISOLATION OXIDE AND RECESS THE ISOLATION OXIDE TO A HEIGHT ABOVE THE SUBSTRATE

600

*FIG. 6*

METHOD AND DEVICE FOR POWER RAIL IN A FIN TYPE FIELD EFFECT TRANSISTOR

FIELD

The present embodiments relate to semiconductor device structures, and more particularly, to structures and processing for transistor devices.

BACKGROUND

As semiconductor devices scale to smaller dimensions, the ability to harness device improvements with decreased size becomes more challenging. The synthesis of three-dimensional semiconductor transistors, such as fin type field effect transistors (finFET), involves challenging processing issues. One challenge in scaling semiconductor devices relates to scaling power rails. Power rails typically provide voltage power supplies or provide a circuit ground for logic finFET devices. The number of power rails in a logic cell affects the height of the logic cell and the size of the power rails affect the resistance of the power rails. Scaling a power rail can increase the resistance of the power rail and, thus, increase heat generation within semiconductor devices.

With respect to these and other considerations, the present disclosure is provided.

BRIEF SUMMARY

In one embodiment, a method of forming a semiconductor device, may include providing a semiconductor device structure. The semiconductor device structure may include semiconductor fins pitched at a fin pitch on a substrate and a mask, disposed over the semiconductor fins. The mask may define a plurality of openings. The semiconductor device structure may also include an isolation oxide disposed on the substrate, between the semiconductor fins. The method may further include directing angled ions into the at least one of the plurality of openings, wherein at least one trench is formed. The trench is formed between at least one pair of the semiconductor fins, in the substrate below the isolation oxide between the at least one pair of the semiconductor fins. Furthermore, a width within the substrate of the at least one trench is greater than a minimum fin pitch and greater than a width of the at least one trench above the substrate.

In another embodiment, a semiconductor device structure may include semiconductor fins, disposed on a substrate, the semiconductor fins pitched at a fin pitch. The semiconductor device structure may also include a buried power rail in a trench on a first side of a cell, disposed in parallel with the semiconductor fins. An isolation oxide may reside between the semiconductor fins and on the buried power rail. Furthermore, a width within the substrate of the buried power rail is greater than a minimum fin pitch and greater than a width of the buried power rail above the substrate.

In a further embodiment, a method for forming a fin type field effect transistor (finFET) device may include providing semiconductor fins on a substrate. The semiconductor fins are pitched at a fin pitch. The finFET device may also provide a mask, disposed over the semiconductor fins and the mask may define a plurality of openings. Furthermore, the finFET device may provide an isolation oxide disposed on the substrate, between the semiconductor fins. The method may further include directing an angled ion beam into a pair of the plurality openings to form a pair of trenches for a cell of the finFET device. The pair of trenches are formed at the fin pitch through the isolation oxide and into the substrate beneath the isolation oxide. The angled ion beam may form portions of each trench of the pair of trenches in the substrate. Furthermore, a width within the substrate of each trench of the pair of trenches is greater than the fin pitch and greater than a width of each trench of the pair of trenches above the substrate.

BRIEF DESCRIPTION OF THE DRAWINGS

FIG. 1A shows a top view of a variant of the semiconductor device structure of FIG. 1A, in accordance with embodiments of the disclosure;

FIG. 1B depicts a side cross-sectional view of a buried power rail of semiconductor device structure, at a stage of fabrication, according to embodiments of the disclosure;

FIG. 1C depicts a side cross-sectional view of another buried power rail of semiconductor device structure, at a stage of fabrication, according to further embodiments of the disclosure;

FIG. 4A shows a processing apparatus, depicted in schematic form, in accordance with embodiments of the disclosure;

FIG. 4B depicts a face view of an extraction arrangement for the processing apparatus of FIG. 4A;

FIG. 4C shows another processing apparatus, depicted in schematic form, in accordance with embodiments of the disclosure; and FIG. 5 shows an exemplary process flow, according to further embodiments of the disclosure.

FIG. 6 shows another exemplary process flow, according to further embodiments of the disclosure.

DETAILED DESCRIPTION

Figure 2A:
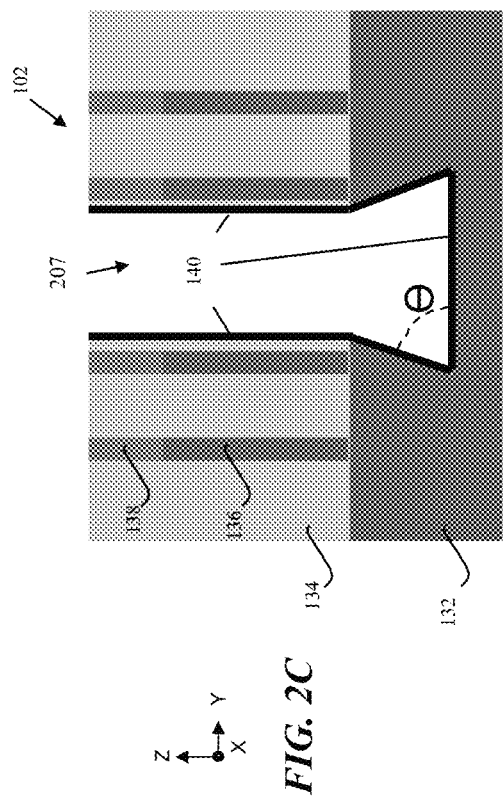
FIG. 2A depicts a side cross-sectional view of a semiconductor device structure, at a stage of fabrication prior to forming a trench for inclusion of a buried power rail, according to embodiments of the disclosure.

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

The present embodiments provide novel techniques and substrate structures to form devices, including three dimensional transistors, formed in a semiconductor substrate. As is known, three dimensional transistors, such as finFETs, may be arranged in circuitry to form various types of logic devices, as well as memory devices.

Turning now to FIG. 1A there is shown a semiconductor device structure 110, according to embodiments of the disclosure. The semiconductor device structure 100 is shown in top view in FIG. 1A, as represented by the X-Y plane of the Cartesian coordinate system shown. The semiconductor device structure 100 depicts an embodiment of a cell comprising fin type field effect transistors (finFET) logic with two or more logic finFETs. The semiconductor device structure 100 comprises two buried power rails 120 and 130, the first buried power rail 120 on a first side of the cell and the second buried power rail 130 on a second side of the cell. The second side is an opposite side of the cell from the first side.

The semiconductor device structure 100 illustrates a set of structures representative of finFET logic. The set of structures include a gate 122, a first portion of a semiconductor fin 124 representative of a source/drain of a finFET, a second portion of a semiconductor fin 126 representative of the drain/source of a finFET, and a gate contact 128. Note that the semiconductor device structure 100 illustrates general structures included in the finFET logic portion of the cell including orientation of such structures but embodiments are not limited to a specific arrangement of such structures.

The gate 122 is a gate of a finFET composed of the first portion of the semiconductor fin 124 and the second portion of the semiconductor fin 126. The first portion of the semiconductor fin 124 and the second portion of the semiconductor fin 126 comprise a single semiconductor fin surrounded on at least three sides by the gate 122. The representations of the first portion 124 as a source/drain and the second portion as a drain/source are included to illustrate how these portions of the semiconductor fin might be implemented in the finFET logic cell. For instance, in one embodiment, the first portion of the semiconductor fin 124 may act as a source and the second portion of the semiconductor fin 126 may act as a drain. In other embodiments, the first portion of the semiconductor fin 124 may act as a drain and the second portion of the semiconductor fin 126 may act as a source.

The gate contact 128 comprises a contact for a gate of the finFET logic of the semiconductor device structure 100. In some embodiments, the gate contact 128 comprises a self-aligned gate contact or a fully self-aligned gate contact.

FIG. 1B depicts a side cross-sectional view of a buried power rail. The buried power rail is the metal line 145 of semiconductor device structure 102, at a stage of fabrication, according to embodiments of the disclosure. The side cross-sectional view of the metal line 145 of semiconductor device structure 102 is represented by the Z-Y plane of the Cartesian coordinate system shown.

The semiconductor device structure 102 depicts one embodiment of the buried power rails 120 and 130 illustrated in FIG. 1A. The semiconductor device structure 102 may include more than one semiconductor fins 136, disposed on a substrate 132, where the substrate 132 may represent any suitable substrate. As an example, the substrate 132 may include a monocrystalline semiconductor portion, such as silicon, where the semiconductor fin 136 is integrally formed from the monocrystalline semiconductor portion. The semiconductor device structure 102 may further include an isolation oxide 134 disposed on the upper surface of the substrate between the semiconductor fins 136. The isolation oxide 134 may represent any suitable isolation oxide such as a silicon dioxide.

A hard mask nitride 138, such as a carbon mask nitride, is disposed on the upper surface of each of the semiconductor fins 136 and the semiconductor fins 136 are pitched at a fin pitch 150. A minimum fin pitch for the semiconductor device structure 102 may be defined based on design criteria and may be, for example, 27 nanometers. A metal line 145 resides partially in the substrate 132 and partially in the isolation oxide 134 layer between a pair of semiconductor fins 136. The isolation oxide on top of the metal line 145 may have a minimum height, H1, such as 20 nanometers.

A dielectric liner 140 may reside between the metal line 145 and the substrate 132 to electrically isolate the metal line 145 from the substrate 132. Dielectric liners such as the dielectric liner 140 and the dielectric liner 144 shown in FIG. 1C may comprise any suitable liner such as a silicon nitride (SiN), silicoboron carbonitride (SiBCN), silicon oxycarbonitride glasses (SiOCN), phosphosilicate glass (PSG), and borophosphosilicate glass (BPSG). In some embodiments, the dielectric liner 144 shown in FIG. 1C may comprise a fluorinated silicate glass (FSG), silicon oxycarbide (SiOxCy), Spin-On-Glass, Spin-On-Polymers, silicon carbon material. In further embodiments, the dielectric liner 144 shown in FIG. 1C may comprise one or more of the liners above, compounds thereof, composites thereof, combinations thereof, or the like, by any suitable method known in the art, such as spinning, chemical vapor deposition (CVD), and plasma-enhanced CVD (PECVD).

The metal line 145 has a width, W2, in the substrate 132 and the width, W2, is greater than a fin pitch 150. In some embodiments, the fin pitch 150 is the minimum fin pitch for the node. The metal line 145 has a width, W1, in the isolation oxide 134 layer and the width, W2, is greater than the width W1. The width, W1, has a maximum width of the minimum fin pitch and an angle of inclination of the metal line between the plane of the substrate 132 and a side of the metal line 145, between the bottom of the metal line 145 in the substrate 132 and the isolation oxide 134 layer, is a maximum of theta, θ. The maximum angle of inclination, θ, of the interior wall of the trench in the substrate 132 is based on the fin pitch 150 and, in some embodiments, is 78 degrees. In other embodiments, the maximum angle of inclination, θ, may differ by several degrees based on the height of the semiconductor fins 136.

A layer of isolation oxide of height H1 resides on top the metal line and between the dielectric liner 140 of the trench where the metal line 145 resides. Note that the metal line 145 as well as the metal line 146 in FIG. 1C refer to a conductor material formed in a trench to form a buried power rail (BPR). The conductor material of the conductor fill may be any suitable, conductive material and is not limited to metal. In many embodiments, the metal line comprises a metal or a metal alloy.

As shown in FIG. 1B, one feature of the semiconductor device structure 102 is the width, W2, of the metal line 145 or of the trench to comprise the metal line 145 in the substrate 132. A defining characteristic of the metal line 145 is the ratio or difference between the width, W2, and the width, W1. The width, W2, of the metal line 145 in the substrate is greater than the width, W1, of the metal line 145 above the substrate 132, in the isolation oxide 134 layer. The increase in the width, W2, in the trench where the metal line 145 resides, increases the amount of conductor material forming the buried power rail. The increase in the conductor material in the power rail advantageously decreases the resistance of the buried power rail and reduces heat generation by the buried power rail.

FIG. 1C depicts a side cross-sectional view of another buried power rail, metal line 146, of semiconductor device structure 104, at a stage of fabrication, according to further embodiments of the disclosure. The semiconductor device structure 104 is similar to the structure in FIG. 1B but the trench for the metal line 146 is formed by a different process. For the semiconductor device structure 104, a silicon nitride liner 142 resides between a dielectric liner 144 at a minimum fin pitch from the top of the isolation oxide formed on the metal line 146 down to partially within the substrate 132 to a depth of D1. For example, the silicon nitride liner 142 may extend a depth, D1, of 10 nanometers or more into the substrate 132 to protect the fins about the metal line 146 while etching a trench for the metal line 146.

A layer of isolation oxide of height H1 resides on top the metal line and between the dielectric liner 144 of the trench where the metal line 146 resides. The height H1 depends on design criteria but may be, for example, 30 nanometers for a 5-nanometer node.

As shown in FIG. 1C, one feature of the semiconductor device structure 104 is the width, W3, of the metal line 146 or trench where the metal line 146 resides in the substrate 132. A defining characteristic of the metal line 146 is the difference or ratio of the width, W1, and the width, W3. The width, W3, of the metal line 146 in the substrate is greater than the width, W1, of the metal line 146 above the substrate 132, in the isolation oxide 134 layer. The width, W1, may be a maximum of the minimum fin pitch such as, e.g., 27 nanometers. The increase in the width, W3, in the trench where the metal line 146 resides, increases the amount of conductor material forming the buried power rail. The increase in the conductor material in the power rail advantageously decreases the resistance of the buried power rail and reduces heat generation by the buried power rail.

FIG. 2A depicts a side cross-sectional view of a semiconductor device structure such as the semiconductor device structure 102 in FIG. 1B or the semiconductor device structure 104 in FIG. 1C, at a stage of fabrication prior to forming a trench for inclusion of a metal line of a buried power rail, according to embodiments of the disclosure. The substrate 132 may form a bottom layer in FIG. 2A but one or more layers may reside below the substrate 132 in some embodiments. For instance, another substrate layer may reside below the substrate 132.

An isolation oxide 134 layer resides on the substrate 132 and about the semiconductor fins 136. The semiconductor fins 136 extend upwards from the substrate 132 to about, e.g., 100 nanometers for a 5-nanometer node and a hard mask nitride 138 resides on top of the semiconductor fins 136 to protect the fins during fabrication of the semiconductor device structure 102 or 104. In many embodiments, a pair of semiconductor fins 200 is pitched at a width, W4, to accommodate a buried power rail. The width W4 may be greater than the minimum fin pitch of, e.g., 27 nanometers. In some embodiments, the smallest pitch, W4, between the pair of semiconductor fins 200 about the trench 207 for the metal line 145 is a 2-fin pitch. For example, the 2-fin pitch can be 54 nanometers for some embodiments where the minimum fin pitch is 27 nanometers. In some embodiments, the smallest pitch, W4, between the pair of semiconductor fins 200 is larger than a 2-fin pitch. In such embodiments, the difference between the width, W4, and a 2-fin pitch is balanced against the area penalty associated with the width, W4, being larger than the 2-fin pitch.

Figure 2C:
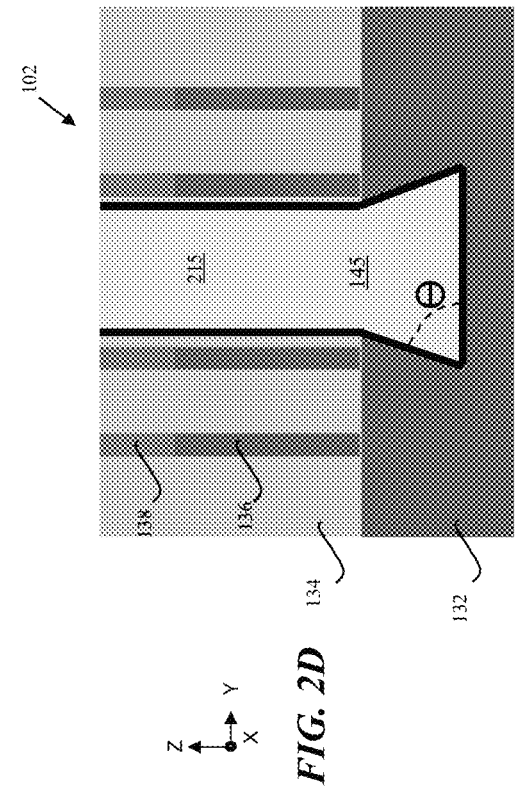
FIGS. 2B-2F depict a side cross-sectional view of a semiconductor device structure, at various stages of fabrication, according to embodiments of the disclosure.
Figure 2B:
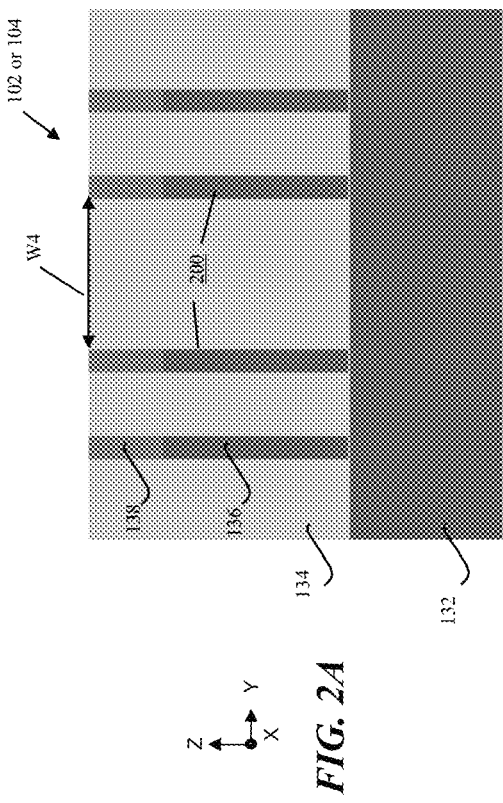

FIGS. 2B-2F illustrate an embodiment of a process for formation of the semiconductor device structure 102 illustrated in FIG. 1B and starts from the semiconductor device structure shown in FIG. 2A. FIG. 2B illustrates a formation of a trench 207 in the substrate 132 by angled reactive ion etching 205. Note that, in some embodiments, the isolation oxide between the pair of semiconductor fins 200 may be removed to the substrate 132, leaving a liner of isolation oxide coating the trench 207 side of the pair of semiconductor fins 200. In other embodiments, the angled reactive ion etching 205 removes at least a portion of the isolation oxide between the pair of semiconductor fins 200.

A tool such as the tool illustrated in FIGS. 4A-C may direct angled ions 208 into the at least one of the plurality of openings between the hard mask nitride 138 to form a trench 207 between the pair of the semiconductor fins 200 in the substrate 132 below an isolation oxide 134. The tool may direct angled ions 208 in a reactive ion etching mixture to selectively etch the substrate below an isolation oxide between the pair of the semiconductor fins 200. In the present embodiment, the reactive ion etching mixture is an anisotropic reactive ion etching mixture. With the anisotropic reactive ion etching mixture, the angled ions 208 selectively etch the substrate below an isolation oxide between the pair 200 of the semiconductor fins 136 in a direction of the angled ions 208 to form a trench 207 in the substrate 132 at a range of angles of incidence, phi $\Phi$, from zero degrees to 12 degrees. The maximum angle of incidence, $\Phi$, is 12 degrees and is based on the fin pitch 150.

Figure 2D:
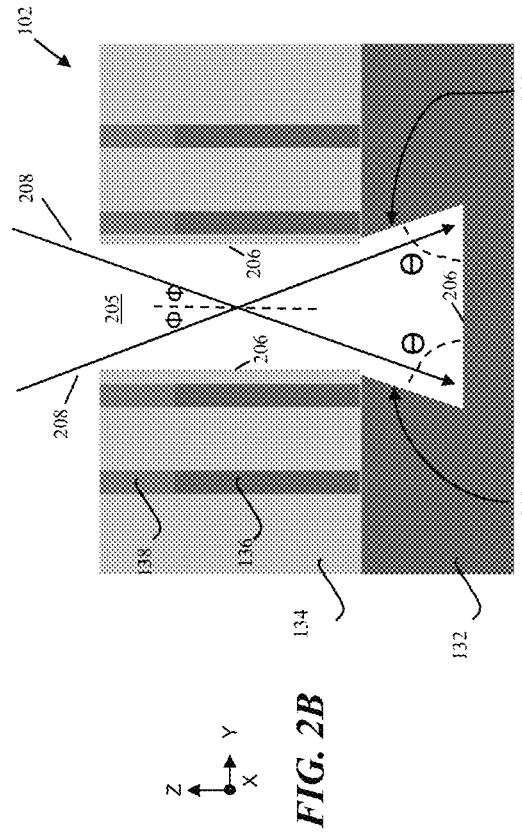

FIG. 2C illustrates a formation of a dielectric liner 140 on the walls 206, 209, and 210 of the trench 207 of the trench in the substrate 132 to electrically isolate the metal line 145 from the substrate 132. Some embodiments also form the dielectric liner 140 on the walls 206 of the trench 207 on the isolation oxide 134. FIG. 2D illustrates a conductor fill and chemical mechanical polishing (CMP) 215 in the trench 207 in the substrate 132. The conductor material of the conductor fill may comprise any suitable conductor such as a metal or metal alloy. The conductor fill can be accomplished by any of many different processes of deposition such as sputtered metal deposition, laser metal deposition, atomic layer deposition, powder metal deposition, and/or the like.

After depositing the conductor material in the trench 207, the excess metal may be removed via CMP to planarize the surface of the semiconductor device structure 102.

Figure 2E:
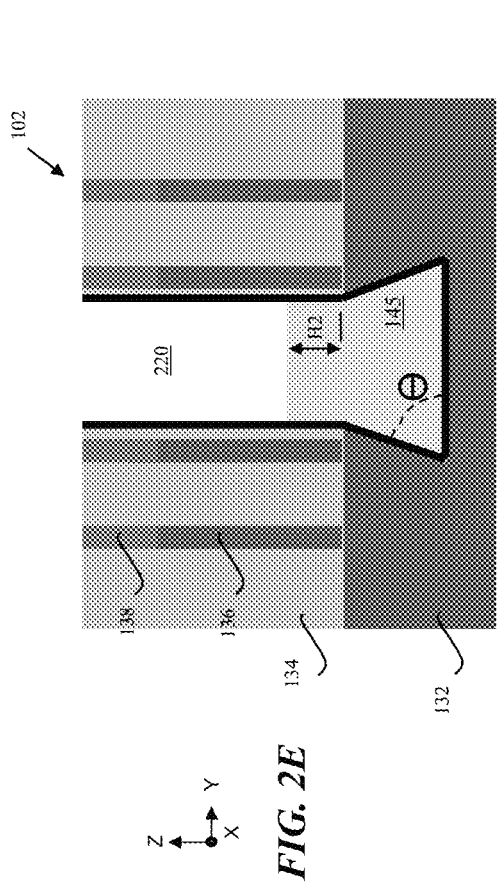
Figure 2F:
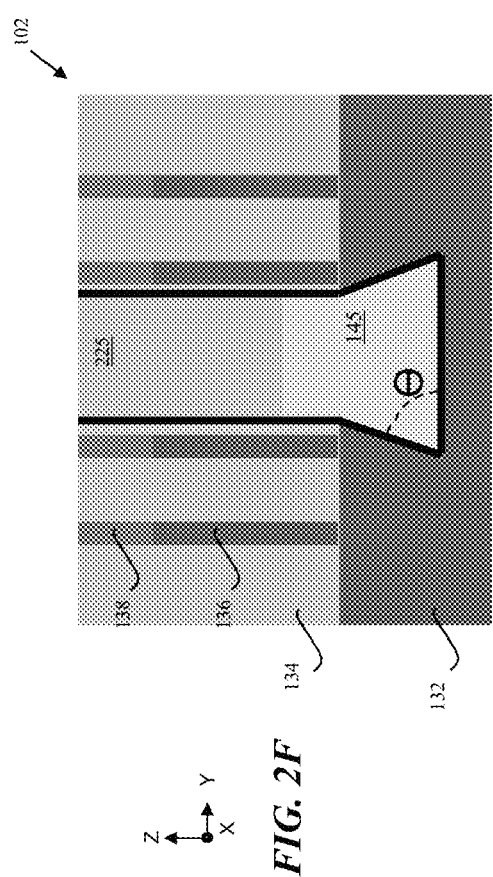

FIG. 2E illustrates a process to recess the conductor material to a height of H2 above the substrate 132 portion of the trench 207 for isolation with gate 220. The height, H2, may be, e.g., 20 nanometers for a 5-nanometer node. FIG. 2F illustrates a process of top isolation fill and CMP 225 to form an isolation oxide on the metal line 145 and to recess the isolation oxide to a height of H1 to form an isolation oxide on the buried power rail.

Figure 3A:
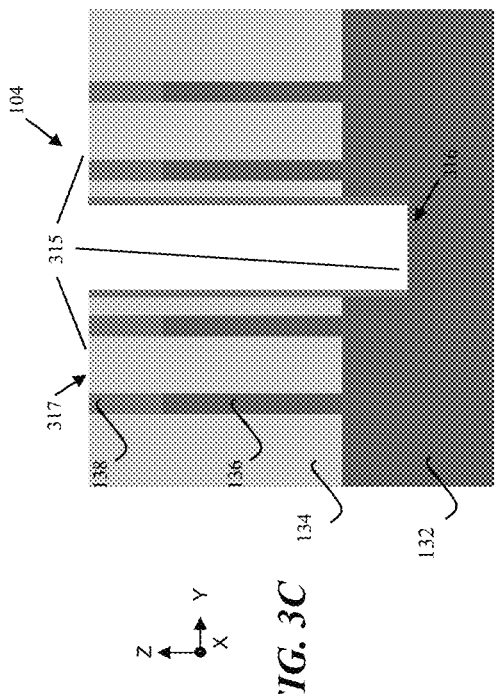
FIGS. 3A-3H depict a side cross-sectional view of a semiconductor device structure, at various stages of fabrication, according to embodiments of the disclosure.

FIGS. 3A-3H illustrate an embodiment of a process for formation of the semiconductor device structure 104 illustrated in FIG. 1C and starts from the semiconductor device structure shown in FIG. 2A. FIG. 3A illustrates a recess 300 of the isolation oxide 134 and a portion of the substrate 132 to a depth of D1 below the substrate 132 between the pair of semiconductor fins 200 at a fin pitch 150. The recess 300 of the isolation oxide 134 and a portion of the substrate 132 can be accomplished by one or more different processes such as lithography and/or etching. Lithography may involve masking portions of the semiconductor device structure illustrated in FIG. 2A other than the fin pitch 150 of isolation oxide 134 between the pair of semiconductor fins 200 and removing materials between the pair of semiconductor fins 200 by exposing a positive photoresist or negative photoresist to ultraviolet light and removing the more soluble material with a developer.

Figure 3C:
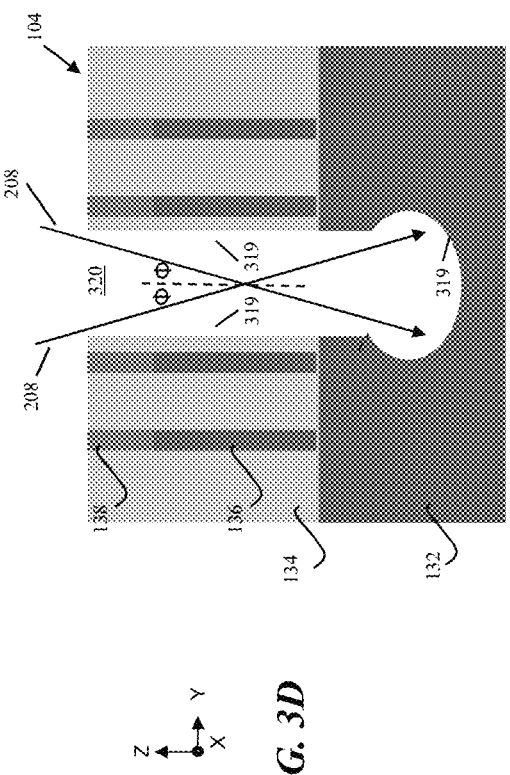
Figure 3B:
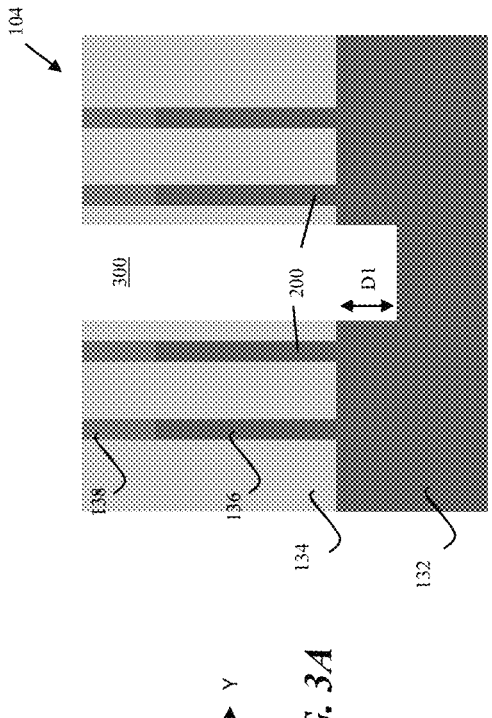

FIG. 3B illustrates silicon nitride liner deposition 305 on the top 317 of the semiconductor device structure 104 and on the surfaces in the trench 322 between the pair of semiconductor fins 200. The silicon nitride liner 142 can protect the pair of semiconductor fins 200 from damage during isotropic reactive ion etching 320 illustrated in FIG. 3D. Other embodiments may use a different suitable liner. The liner can be deposited by any suitable process.

Figure 3D:
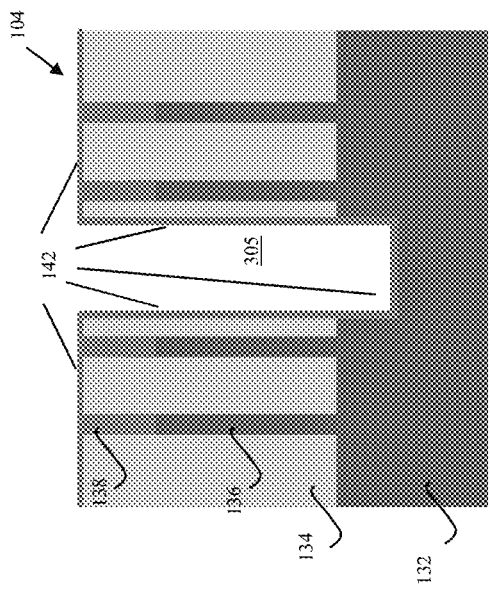

After deposition of the silicon nitride liner 142, the silicon nitride liner 142 is etched back from the top of the semiconductor device structure 104 and from the bottom of the trench 207 as illustrated in FIG. 3C. Etching the silicon nitride liner 142 from the bottom of the trench 322 reveals the substrate. Directing the angled ions 208 in an isotropic reactive ion etching mixture, selectively etches the substrate below an isolation oxide between and below the at least one pair of the semiconductor fins 200 in multiple directions. The isotropic reactive ion etching mixture creates a bulbous profile in the substrate 132 as shown in FIG. 3D while the protecting the pair of semiconductor fins 200 from damage.

Figure 3E:
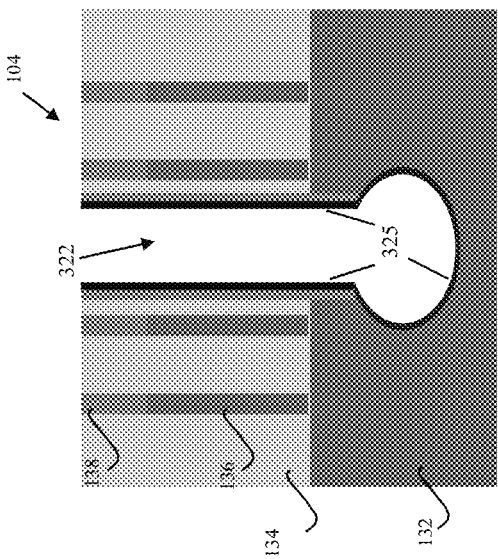

FIG. 3E illustrates deposition of a dielectric liner 325 on walls 319 of the trench 322 between the trench 322 and the substrate 132 as well as between the trench 322 and the silicon nitride liner 142 of the isolation oxide 134 layer. The silicon nitride liner 142 can be added to the trench 322 by any suitable process such as chemical vapor deposition, physical vapor deposition, ion beam assisted deposition, and/or the like.

Figure 3F:
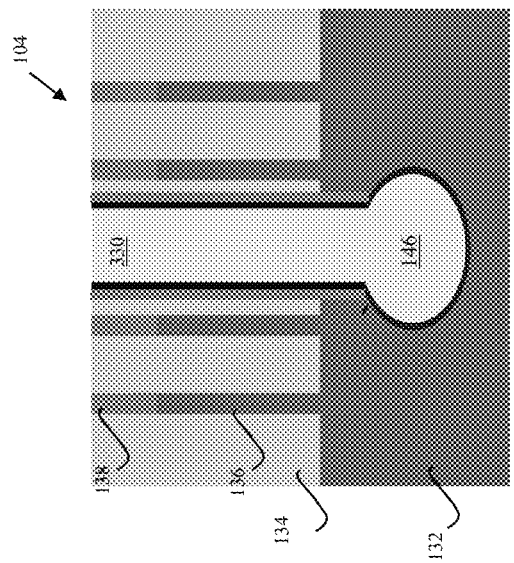
Figure 3G:
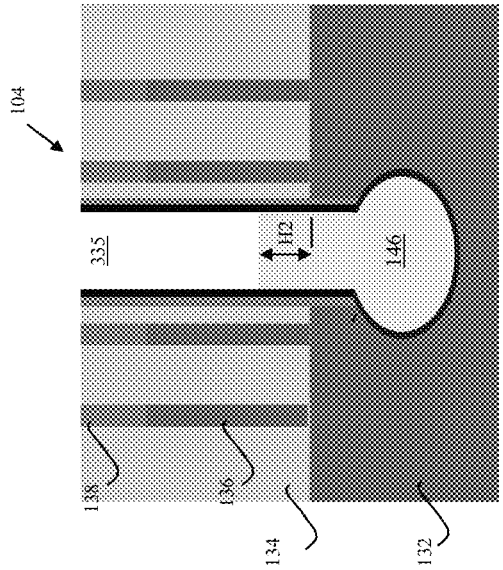

FIG. 3F illustrates a conductor fill and CMP 330 of the trench 322 of the semiconductor device structure. Once the excess conductor material is removed via polishing or planarization, the metal is recessed for isolation with gate 335 as shown in FIG. 1G. The conductor material is recessed to a height, H2, above the substrate such as a height of approximately 20 nanometers to provide about 30 nanometers of isolation oxide over the metal line 146 and expose about 50 nanometers of the semiconductor fins 136.

Figure 3H:
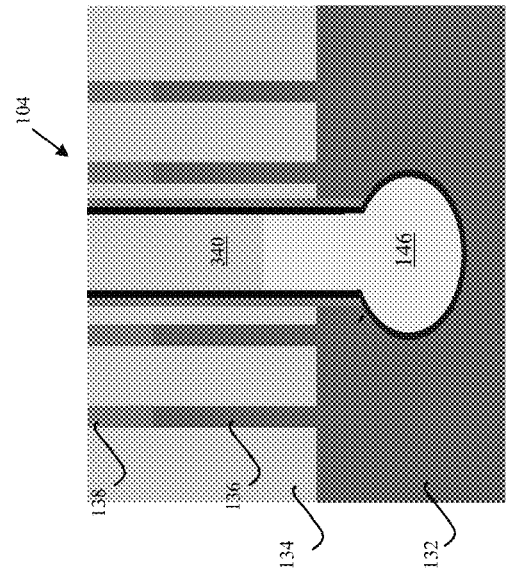

FIG. 3H illustrates a top isolation and CMP 340 of the trench 322 of the semiconductor device structure 104 to form an isolation oxide layer between the top of the conductor fill and the top of the semiconductor device structure, such as a flowable oxide. Thereafter, the isolation oxide is recessed to a height of H1 to form the semiconductor device structure 104 illustrated in FIG. 1C. In some embodiments, the height of H1 is about 30 nanometers.

In further embodiments of the disclosure, angled ions 208 may be provided as an ion beam to etch trenches such as the trench 207 illustrated in FIG. 2C or the trench 322 illustrated in FIG. 3E for buried power rails for a cell. Turning now to FIG. 4A, there is shown a processing apparatus 400, depicted in schematic form. The processing apparatus 400 represents a processing apparatus for performing anisotropic or isotropic reactive ion etching. The processing apparatus 400 may be a plasma based processing system having a plasma chamber 402 for generating a plasma 404 therein by any convenient method as known in the art. An extraction plate 406 may be provided as shown, having an extraction aperture 408, where an angled ion beam 410 may be extracted to direct angled ions 208 to a substrate 132. The substrate 132, including, for example, the semiconductor fin 136, is disposed in the process chamber 424. A substrate plane of the substrate 132 is represented by the X-Y plane of the Cartesian coordinate system shown, while a perpendicular to the plane of substrate lies along the Z-axis (Z-direction).

As further shown in FIG. 4A, the angled ion beam 410 may be extracted when a voltage difference is applied using bias supply 420 between the plasma chamber 402 and substrate 132, or substrate platen 414, as in known systems. The bias supply 420 may be coupled to the process chamber 424, for example, where the process chamber 424 and substrate 132 are held at the same potential.

According to various embodiments, the angled ion beam 410 may be extracted at a non-zero angle of incidence, shown as Φ, with respect to the perpendicular 426. The trajectories of ions within the angled ion beam 410 may be mutually parallel to one another or may lie within a narrow angular range, such as within 10 degrees of one another or less. Thus, the value of Φ may represent an average value of incidence angle where the individual trajectories vary up to several degrees from the average value. In some embodiments, the angle of Φ may be 12 degrees, to form a sidewall in a trench with a 78-degree angle of inclination. In many embodiments, the 78-degree angle of inclination may be a maximum angle of inclination based at least in part on the fin pitch.

In various embodiments, the angled ion beam 410 may be extracted as a continuous beam or as a pulsed ion beam as in known systems. For example, the bias supply 420 may be configured to supply a voltage difference between plasma chamber 402 and process chamber 424, as a pulsed, direct current (DC) voltage, where the voltage, pulse frequency, and duty cycle of the pulsed voltage may be independently adjusted from one another.

In various embodiments, a suitable gas or combination of gases, may be supplied by the source 422 to plasma chamber 402. The plasma 404 may generate various species to perform reactive ion beam etching, depending upon the exact composition of species provided to the plasma chamber 402. The species provided by source 422 may be designed according to material to be etched, such as known reactive ion etching species for etching silicon.

In various embodiments, the angled ion beam 410 may be provided as a ribbon ion beam having a long axis extending along the X-direction of the Cartesian coordinate system shown in FIG. 4B. By scanning a substrate platen 414 including substrate 132 with respect to the extraction aperture 408, and thus with respect to the angled ion beam 410 along the scan direction 430, the angled ion beam 410 may etch exposed portions of the substrate 132 as well as isolation oxide 134 on the substrate in some embodiments. In many embodiments, the angled ion beam does not etch a silicon nitride liner 142 illustrated in FIG. 3B.

In this example of FIG. 4B, the angled ion beam 410 is provided as a ribbon ion beam extending to a beam width along the X-direction, where the beam width is adequate to expose an entire width of the substrate 132, even at the widest part along the X-direction. Exemplary beam widths may be in the range of 10 cm, 20 cm, 30 cm, or more while exemplary beam lengths along the Y-direction may be in the range of 2 mm, 3 mm, 5 mm, 10 mm, or 20 mm A ratio of beam width to beam length may be in the range 5/1, 10/1, 20/1 50/1, or 100/1. The embodiments are not limited in this context.

Notably, the scan direction 430 may represent the scanning of substrate 132 in two opposing (180 degrees) directions along the Y-direction, or just a scan toward the left or a scan toward the right. As shown in FIG. 2B and FIG. 3D, the long axis of angled ion beam 410 extends along the X-direction, perpendicularly to the scan direction 430. Accordingly, an entirety of the substrate 132 may be exposed to the angled ion beam 410 when scanning of the substrate 132 takes place along a scan direction 430 to an adequate length from a left side to right side of substrate 132, as shown in FIG. 2B.

Returning also to FIG. 2B, in accordance with various embodiments, the angled ions 208 may be supplied in a plurality of scans of the substrate 132, by rotating the substrate 132 through 180 degrees between scans. Thus, in a first scan, the angled ions 208 may be directed to the sidewall 209, while in a second scan the angled ions 208 may be directed to a sidewall 210, by rotating the substrate 132 180 degrees between the first scan and second scan, while not changing the actual orientation of an ion beam, such as angled ion beam 410.

In other embodiments of the disclosure, a modified apparatus may be used to provide simultaneous etching of a substrate in different directions. Turning now to FIG. 4C, there is shown another processing apparatus 440, depicted in schematic form. The processing apparatus 440 represents a processing apparatus for performing angled ion treatment of a substrate, and may be substantially the same as the processing apparatus 400, save for the differences discussed below. Notably, the processing apparatus 440 includes a beam blocker 432, disposed adjacent the extraction aperture 408. The beam blocker 432 is sized and positioned to define a first aperture 408A and a second aperture 408B, where the first aperture 408A forms a first angled ion beam 410A, and the second aperture 408B forms a second angled ion beam 410B. The two angled ion beams may define angles of incidence with respect to the perpendicular 426, equal in magnitude, opposite in direction. The beam blocker offset along the Z-axis with respect to extraction plate 406 may help define the angle of the angled ion beams. As such, the first angled ion beam 410A and the second angled ion beam 410B may treat opposing sidewalls of a semiconductor fin similarly and simultaneously, as generally depicted in FIG. 2B. When configured in the shape of a ribbon beam as in FIG. 4B, these angled ion beams may expose an entirety of the substrate 132 to reactive ion etching of the substrate 132 on opposite sides of the cell to form metal lines as buried power rails for the cell, by scanning the substrate platen 414 as shown.

FIG. 5 depicts an exemplary process flow 500, according to embodiments of the disclosure. At block 502, a semiconductor device structure is provided. The semiconductor device structure comprises a plurality of semiconductor fins pitched at a fin pitch on a substrate and a mask, disposed over the plurality of semiconductor fins. The mask may define a plurality of openings. The semiconductor device structure further comprises an isolation oxide disposed on a substrate, between the plurality of semiconductor fins.

At block 504, angled ions are directed into the plurality of openings of the mask, wherein at least one trench is formed between at least one pair of the semiconductor fins in the substrate below an isolation oxide between the at least one pair of the semiconductor fins. A feature of the trench is a width within the substrate of the at least one trench being greater than the fin pitch. According to various embodiments, the angled ions may be provided as an angled ion beam or pair of angled ion beams in a reactive ion etching mixture. The angled ion beam may define a non-zero angle of incidence with respect to a perpendicular to a plane of the substrate. In particular embodiments, the angled ion beam may be a ribbon ion beam.

At block 506, a dielectric liner is applied to the trench and the substrate. The liner may electrically insulate the buried power rail from the substrate.

At block 508, the pair of trenches are filled with a conductor material such as a metal or a metal alloy. At block 510, the conductor material may be recessed or removed and an isolation oxide is formed over the conductor fill, between the pair of semiconductor fins. The conductor material forms the buried power rail and, advantageously, may include up to 30% more conductor material. The increase in conductor material can, advantageously, reduce the metal line resistance.

FIG. 6 depicts an exemplary process flow 600, according to embodiments of the disclosure. At block 602, a semiconductor device structure is provided, comprising multiple semiconductor fins on a substrate, the multiple semiconductor fins pitched at a fin pitch and a mask, disposed over the multiple semiconductor fins, the mask defining a plurality of openings. The semiconductor device structure may further comprise an isolation oxide disposed on a substrate, between the multiple semiconductor fins.

At block 604, angled ions are directed directing an angled ion beam into a pair of the plurality openings for a cell to form a pair of trenches, wherein the pair of trenches are formed at a fin pitch through the isolation oxide and into a substrate beneath the isolation oxide. A first trench of the pair may be disposed on a first side of the cell and parallel to the multiple semiconductor fins. A second trench of the pair may be disposed on a second side of the cell, the second side being on an opposite side of the cell from the first side and may be parallel to the first side. The angled ion beam may form portions of each of the pair of trenches in the substrate, wherein a width within the substrate of each of the pair of trenches is greater than the fin pitch. For instance, the width within the substrate of each of the pair of trenches may be greater than a minimum fin pitch for the semiconductor device. According to various embodiments, the angled ions may be provided as an angled ion beam or pair of angled ion beams in a reactive ion etching mixture, either isotropic or anisotropic. The angled ion beam may define a non-zero angle of incidence with respect to a perpendicular to a plane of the substrate. In particular embodiments, the angled ion beam may be a ribbon ion beam. Angled ions of the angled ion beam may selectively etch the substrate below the isolation oxide between the at least one pair of the semiconductor fins in multiple directions in response to the angled ions At block 606, the pair of trenches are filled with a conductor material, such as a metal or metal alloy. In many embodiments, the trenches are prepared for the conductor fill prior to performance of the conductor fill by forming a dielectric liner on the walls of the trench, inside the trench. Thereafter, the conductor material is recessed.

At block 608, an isolation oxide is formed over the conductor material, in a trench disposed between the pair of semiconductor fins. The isolation oxide may then be recessed to a height of about 20 nanometers above the conductor material.

The present embodiments provide various advantages over known finFET processes. For one advantage, the wider trench bottom provided by the present embodiments increases the trench volume by about 30%. The increase in the trench volume allows an increase of about 30% in the metal volume in a buried power rail in the trench, and accordingly reduces the resistance of the buried power rail. The reduced resistance can advantageously be realized without a corresponding increase in the height of the cell. For another advantage, the reduced resistance in the buried power rails based on the increase in the metal volume in the trenches facilitates scaling of the cell height of the logic of the finFET, saving device real estate.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method of forming a semiconductor device, comprising:
   providing a semiconductor device structure, the semiconductor device structure comprising:
      semiconductor fins pitched at a fin pitch on a substrate;
      a mask, disposed over the semiconductor fins, the mask defining a plurality of openings; and
      an isolation oxide disposed on the substrate, between the semiconductor fins; and
   directing angled ions into the at least one of the plurality of openings, wherein at least one trench is formed between at least one pair of the semiconductor fins, in the substrate below the isolation oxide between the at least one pair of the semiconductor fins, wherein a width within the substrate of the at least one trench is greater than a minimum fin pitch and greater than a width of the at least one trench above the substrate.

2. The method of claim 1, wherein the directing the angled ions comprises providing the angled ions in a reactive ion etching mixture, wherein the angled ions selectively etch the substrate below the isolation oxide between the at least one pair of the semiconductor fins.

3. The method of claim 1, wherein the directing the angled ions comprises providing the angled ions in an anisotropic reactive ion etching mixture, wherein the angled ions selectively etch the substrate below an isolation oxide between the at least one pair of the semiconductor fins in a direction of the angled ions.

4. The method of claim 1, wherein the method further comprises: forming a dielectric liner on walls of the at least one trench on the substrate and on the isolation oxide; depositing a conductor in the trench, planarizing the semiconductor device structure; removing a portion of the conductor from the trench in the isolation oxide to a first height above the substrate; forming the isolation oxide on the conductor; planarizing the semiconductor device; and removing the isolation oxide to a height above the conductor, revealing the at least one pair of the semiconductor fins.

5. The method of claim 1, comprising directing the angled ions as an ion beam having a shape of a ribbon beam to the substrate, the ion beam defining a trajectory forming a non-zero angle of incidence with respect to a plane of the substrate.

6. The method of claim 5, wherein the ion beam defining the trajectory forming the non-zero angle of incidence with respect to the plane of the substrate forms a wall of the at least one trench, the wall having an angle of inclination, wherein the angle of inclination is a maximum of 78 degrees.

7. The method of claim 1, wherein a silicon nitride liner is disposed on the isolation oxide and the substrate between the at least one pair of the semiconductor fins in the trench, from a top of the at least one pair of the semiconductor fins on the isolation oxide to partially within the substrate below the at least one pair of the semiconductor fins.

8. The method of claim 7, wherein the directing the angled ions comprises providing the angled ions in an isotropic reactive ion etching mixture, wherein the angled ions selectively etch the substrate below the isolation oxide between the at least one pair of the semiconductor fins in multiple directions in response to the angled ions.

9. A semiconductor device structure, comprising:
   semiconductor fins, disposed on a substrate, the semiconductor fins pitched at a fin pitch;
   a buried power rail in a trench on a first side of a cell, disposed in parallel with the semiconductor fins;
   a silicon nitride liner between the buried power rail and the substrate; and
   an isolation oxide between the semiconductor fins and on the buried power rail;
   wherein a width within the substrate of the buried power rail is greater than a minimum fin pitch and greater than a width of the buried power rail above the substrate.

10. The semiconductor device structure of claim 9, the dielectric liner electrically isolating the buried power rail from the substrate.

11. The semiconductor device structure of claim 9, the buried power rail comprising a portion of a conductor above the substrate, wherein the dielectric liner is disposed between the conductor and the silicon dioxide.

12. The semiconductor device structure of claim 11, further comprising a silicon nitride liner between the dielectric liner and the isolation oxide, wherein the silicon nitride liner extends partially into the substrate.

13. The semiconductor device structure of claim 12, further comprising a second buried power rail on a second side of the cell, wherein the second side of the cell is an opposite side of the cell from the first side; wherein the buried power rail and the second buried power rail provide a power rail and a circuit ground to two or more logic fin type field effect transistors (finFETs) of the semiconductor device, wherein the two or more logic finFETs reside between the buried power rail and the second buried power rail.

14. A method for forming a fin type field effect transistor (finFET) device, comprising
   providing semiconductor fins on a substrate, the semiconductor fins pitched at a fin pitch;
   providing a mask, disposed over the semiconductor fins, the mask defining a plurality of openings;
   providing an isolation oxide disposed on the substrate, between the semiconductor fins; and
   directing an angled ion beam into a pair of the plurality openings to form a pair of trenches for a cell of the finFET device, wherein the pair of trenches are formed at the fin pitch through the isolation oxide and into the substrate beneath the isolation oxide, the angled ion beam to form portions of each trench of the pair of trenches in the substrate, wherein a width within the substrate of each trench of the pair of trenches is greater than the fin pitch and greater than a width of each trench of the pair of trenches above the substrate.

15. The method of claim 14, further comprising lining the pair of trenches with a dielectric liner.

16. The method of claim 14, further comprising filling the pair of trenches with a conductor material, removing a portion of the conductor material, and forming the isolation oxide on the conductor material.

17. The method of claim 14, wherein the directing the angled ion beam comprises providing the angled ion beam in an anisotropic reactive ion etching mixture, wherein the angled ions selectively etch the substrate below the isolation oxide in the pair of the plurality of openings in a direction of the angled ions.

18. The method of claim 14, wherein the directing the angled ion beam comprises providing the angled ion beam in an isotropic reactive ion etching mixture, wherein the angled ions selectively etch the substrate below the isolation oxide in the pair of the plurality of openings in multiple directions in response to the angled ions.

\* \* \* \* \*